(12) United States Patent
Zhang et al.

(10) Patent No.: US 11,360,507 B2
(45) Date of Patent: Jun. 14, 2022

(54) DISPLAY PANEL AND METHOD OF MANUFACTURING THE SAME, DISPLAY DEVICE

(71) Applicant: BOE TECHNOLOGY GROUP CO., LTD., Beijing (CN)

(72) Inventors: Xiaojin Zhang, Beijing (CN); Dan Wang, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 113 days.

(21) Appl. No.: 16/624,076

(22) PCT Filed: Apr. 15, 2019

(86) PCT No.: PCT/CN2019/082753
§ 371 (c)(1),
(2) Date: Dec. 18, 2019

(87) PCT Pub. No.: WO2019/223456
PCT Pub. Date: Nov. 28, 2019

(65) Prior Publication Data
US 2020/0209916 A1 Jul. 2, 2020

(30) Foreign Application Priority Data

May 24, 2018 (CN) .......................... 201810509065.7

(51) Int. Cl.
*H01L 51/00* (2006.01)
*G06F 1/16* (2006.01)
(Continued)

(52) U.S. Cl.
CPC .............. *G06F 1/1609* (2013.01); *G02B 1/14* (2015.01); *G06F 1/1652* (2013.01); *G09F 9/301* (2013.01);
(Continued)

(58) Field of Classification Search
None
See application file for complete search history.

(56) References Cited

U.S. PATENT DOCUMENTS 6,858,983 B2    2/2005  Mochizuki et al.
9,323,292 B2*   4/2016  Bae .......................... H04M 1/18
(Continued)

FOREIGN PATENT DOCUMENTS

CN    101930701 A    12/2010
CN    105226079 A     1/2016
(Continued)

OTHER PUBLICATIONS

International Search Report and Written Opinion issued in corresponding International Application No. PCT/CN2019/082753, dated Jul. 12, 2019, with English language translation.
(Continued)

*Primary Examiner* — Anthony Q Edwards
*Assistant Examiner* — Rashen E Morrison
(74) *Attorney, Agent, or Firm* — McDermott Will & Emery LLP

(57) ABSTRACT

A display panel includes: a flexible substrate, and the flexible substrate includes an intermediate region and a preset bending region located at at least one side of a periphery of the intermediate region; a display layer located at a side of the flexible substrate; and a transparent cover film layer located at a side of the display layer away from the flexible substrate, and the transparent cover film layer includes a first portion located at a side of the display layer away from the intermediate region, and a second portion located at a side of the display layer away from the preset bending region. The first portion is connected to the second
(Continued)

portion, and the thickness of at least partial region of the second portion progressively decreases in a direction away from the first portion.

19 Claims, 10 Drawing Sheets

(51) Int. Cl.
*G02B 1/14* (2015.01)
*G09F 9/30* (2006.01)
*H01L 51/52* (2006.01)
*H01L 51/56* (2006.01)

(52) U.S. Cl.
CPC ...... *H01L 51/0097* (2013.01); *H01L 51/5253* (2013.01); *H01L 51/56* (2013.01)

(56) References Cited

U.S. PATENT DOCUMENTS

| | | | | |
|---|---|---|---|---|
| 2009/0257207 A1* | 10/2009 | Wang | ............... | H04M 1/0252 361/752 |
| 2010/0327737 A1 | 12/2010 | Hayashi et al. | | |
| 2014/0168090 A1* | 6/2014 | Aaltonen | ............... | G06F 3/041 156/60 |
| 2015/0331451 A1* | 11/2015 | Shin | ............... | G06F 1/1626 345/173 |
| 2016/0299527 A1* | 10/2016 | Kwak | ............... | G06F 1/1656 |
| 2016/0365393 A1 | 12/2016 | Kim et al. | | |
| 2017/0090661 A1 | 3/2017 | Kim et al. | | |
| 2017/0160766 A1* | 6/2017 | Gupta | ............... | G02F 1/1368 |
| 2019/0273217 A1* | 9/2019 | Lee | ............... | G06F 3/0414 |

FOREIGN PATENT DOCUMENTS

| | | |
|---|---|---|
| CN | 106252376 A | 12/2016 |
| CN | 107025014 A | 8/2017 |
| CN | 107221257 A | 9/2017 |
| CN | 107978623 A | 5/2018 |
| CN | 108711577 A | 10/2018 |

OTHER PUBLICATIONS

First Chinese Office Action issued in corresponding Chinese Application No. 201810509065.7, dated Mar. 26, 2020, with English language translation.

* cited by examiner

DISPLAY PANEL AND METHOD OF MANUFACTURING THE SAME, DISPLAY DEVICE

CROSS-REFERENCE TO RELATED APPLICATION

This application is a national phase entry under 35 USC 371 of International Patent Application No. PCT/CN2019/082753 filed on Apr. 15, 2019, which claims priority to Chinese Patent Application No. 201810509065.7, filed with the Chinese Patent Office on May 24, 2018, titled "DISPLAY PANEL AND METHOD OF MANUFACTURING THE SAME, DISPLAY DEVICE", which are incorporated herein by reference in their entirety.

TECHNICAL FIELD

The present disclosure relates to the field of flexible display technologies, and in particular, to a display panel and a method of manufacturing the same, a display device.

BACKGROUND

With the continuous development of display technologies, flexible display panels have got more and more attention since they are bendable and have good flexibility. The flexible display panel includes a flexible organic light-emitting diode (OLED) display panel, a flexible electrophoretic display (EPD) panel, and a flexible liquid crystal display (LCD) panel.

SUMMARY

In one aspect, some embodiments of the present disclosure provide a display panel. The display panel includes a flexible substrate, a display layer located at a side of the flexible substrate, and a transparent cover film layer located at a side of the display layer away from the flexible substrate. The flexible substrate includes an intermediate region and a preset bending region located at at least one side of a periphery of the intermediate region. The transparent cover film layer includes a first portion located at a side of the display layer away from the intermediate region, and a second portion located at a side of the display layer away from the preset bending region. The first portion is connected to the second portion, and a thickness of at least partial region of the second portion progressively decreases in a direction away from the first portion.

In some embodiments, a thickness of the second portion progressively decreases from a position where the second portion is connected to the first portion in a direction away from the first portion.

In some embodiments, the display layer includes a plurality of light-emitting devices. The transparent cover film layer includes a thin film encapsulation layer, and the thin film encapsulation layer is configured to encapsulate the plurality of light-emitting devices.

In some embodiments, the first portion includes at least one film layer disposed in a stack, and the second portion includes at least one film layer that is connected in one-to-one correspondence to the at least one film layer of the first portion. A thickness of at least partial region of the at least one film layer of the second portion progressively decreases in a direction away from the first portion.

In some embodiments, the first portion includes a first organic layer, and the second portion includes a second organic layer. The first organic layer is connected to the second organic layer, and a thickness of the region of at least a portion of the second organic layer progressively decreases in a direction away from the first organic layer.

In some embodiments, the first portion further includes a first inorganic layer located at a side of the first organic layer proximate to the flexible substrate, and the second portion further includes a second inorganic layer located at a side of the second organic layer proximate to the flexible substrate. The first inorganic layer is connected to the second inorganic layer, and the first inorganic layer and the second inorganic layer have a same thickness.

In some embodiments, the first portion further includes a third inorganic layer located at a side of the first organic layer away from the flexible substrate, and the second portion further includes a fourth inorganic layer located at a side of the second organic layer away from the flexible substrate. The third inorganic layer is connected to the fourth inorganic layer, and the third inorganic layer and the fourth inorganic layer have a same thickness.

In some embodiments, the display panel further includes a thin film encapsulation layer and a bonding layer that are both located between the display layer and the transparent cover film layer. The display layer includes a plurality of light-emitting devices. The thin film encapsulation layer is configured to encapsulate the plurality of light-emitting devices, and the bonding layer is configured to bond the thin film encapsulation layer and the transparent cover film layer.

In some embodiments, the display layer includes a plurality of light-emitting devices, each of the plurality of light-emitting devices includes a top-emitting light-emitting device. The top-emitting light-emitting device includes a reflective electrode, a light-emitting functional layer, a transmissive electrode, and a capping layer that are disposed sequentially away from the flexible substrate.

In some embodiments, a thickness of the first portion is uniform, and a thickness of the position where the second portion is connected to the first portion is equal to a thickness of the first portion.

In some embodiments, the flexible substrate further includes an edge region located at a side of the preset bending region away from the intermediate region.

The transparent cover film layer further includes a third portion located at a side of the display layer away from the edge region, and the third portion is connected to the second portion.

In some embodiments, a thickness of the third portion progressively decreases from a position where the third portion is connected to the second portion in a direction away from the second portion.

In some other embodiments, a thickness of the third portion is equal to the thickness of the second portion at a position where the third portion is connected to the second portion.

In another aspect, some embodiments of the present disclosure provide a display device. The display device includes the display panel as described in any one of the above embodiments.

In yet another aspect, some embodiments of the present disclosure provide a method of manufacturing a display panel. The method includes: providing a flexible substrate; forming a display layer located at a side of the flexible substrate; forming a transparent cover film layer located at a side of the display layer away from the flexible substrate; and bending the preset bending region toward a direction away from the display layer. The flexible substrate includes an intermediate region and a preset bending region located at at least one side of a periphery of the intermediate region. The preset bending region of the flexible substrate is configured to be bendable toward a direction away from the display layer. The transparent cover film layer includes a first portion located at a side of the display layer away from the intermediate region, and a second portion located at a side of the display layer away from the preset bending region. The first portion is connected to the second portion, and a thickness of at least partial region of the second portion progressively decreases in a direction away from the first portion.

In some embodiments, the thickness of the second portion formed progressively decreases from the position where the second portion is connected to the first portion in a direction away from the first portion.

In some embodiments, forming the display layer at a side of the flexible substrate, includes: forming a plurality of light-emitting devices on the intermediate region and the preset bending region. Forming the transparent cover film layer at a side of the display layer away from the flexible substrate, includes: forming a thin film encapsulation layer at a side of the display layer away from the flexible substrate, the thin film encapsulation layer being configured to encapsulate the plurality of light-emitting devices.

In some embodiments, forming the transparent cover film layer at a side of the display layer away from the flexible substrate, includes: forming, by using an inkjet printing process, a first organic layer at a side of the display layer away from the intermediate region, and a second organic layer at a side of the display layer away from the preset bending region, the first organic layer being connected to the second organic layer, controlling, by adjusting process parameters of the inkjet printing process, a thickness of at least partial region of the second organic layer to progressively decrease in a direction away from the first organic layer.

In some embodiments, before forming the first organic layer and the second organic layer, forming the transparent cover film layer at a side of the display layer away from the flexible substrate, further includes: forming, by using a same deposition process, a first inorganic layer at a side of the display layer away from the intermediate region, and a second inorganic layer at a side of the display layer away from the preset bending region, the first inorganic layer and the second inorganic layer being connected and having a same thickness.

In some embodiments, after forming the first organic layer and the second organic layer, forming the transparent cover film layer at a side of the display layer away from the flexible substrate, further includes: forming, by using a same deposition process, a third inorganic layer at a side of the first organic layer away from the flexible substrate, and a fourth inorganic layer at a side of the second organic layer away from the flexible substrate. The third inorganic layer and the fourth inorganic layer are connected and have a same thickness.

In some embodiments, forming the display layer at a side of the flexible substrate, includes: forming a plurality of light-emitting devices on the intermediate region and the preset bending region. Before forming the transparent cover film layer at a side of the display layer away from the flexible substrate, the method of manufacturing a display panel further include: forming a thin film encapsulation layer at a side of the display layer away from the flexible substrate; and forming a bonding layer at a side of the thin film encapsulation layer away from the display layer. The thin film encapsulation layer is configured to encapsulate the plurality of light-emitting device, and the bonding layer being configured to bond the thin film encapsulation layer and the transparent cover film layer.

In some embodiments, the preset bending region is configured to be bendable toward a direction away from the display layer.

BRIEF DESCRIPTION OF THE DRAWINGS

In order to describe technical solutions in some embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings.

DETAILED DESCRIPTION

Figure 1:
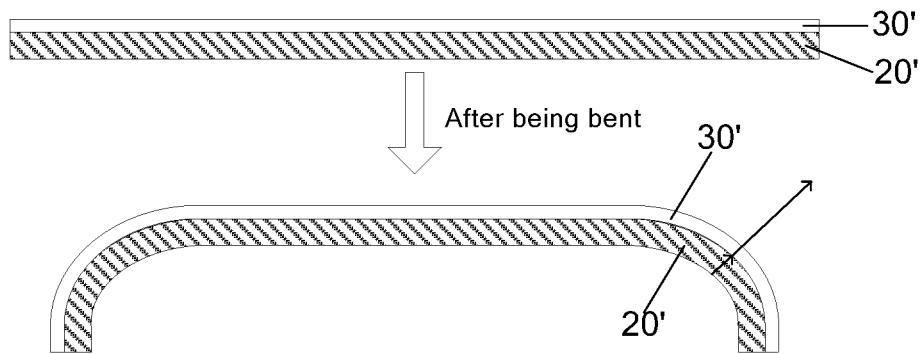
FIG. 1 is a schematic diagram showing structures of a display panel before and after being bent, according to the related art.

The technical solutions in some embodiments of the present disclosure will be described clearly and completely with reference to the accompanying drawings in some embodiments of the present disclosure. Obviously, the described embodiments are merely some but not all of embodiments of the present disclosure.

All other embodiments made on the basis of some embodiments of the present disclosure by a person of ordinary skill in the art without paying any creative effort shall be included in the protection scope of the present disclosure.

In the following, the terms "first" and "second" are only used for descriptive purposes and are not to be construed as indicating or implying a relative importance or implicitly indicating the number of indicated technical features. Thus, a feature defined by "first", "second" may explicitly or implicitly include one or more of the features. In the description of the embodiments of the present disclosure, "a plurality of" means two or more unless otherwise specified. "And/or" merely describes an association relationship of associated objects, and represents three kinds of relationships, for example, A and/or B, represents that A exists separately, A and B exist simultaneously, or B exists separately. Orientations or positional relationships indicated by terms "upper/above", "lower/below", etc. are based on orientations or positional relationships shown in the accompanying drawings, merely for the convenience of explaining simplified descriptions of the technical solutions of the present disclosure, but not to indicate or imply that the referred devices or elements must have a particular orientation, or must be constructed or operated in a particular orientation. Therefore, they should not be construed as limitations to the present disclosure.

Moreover, for clarity, an area of at least one region and/or a thicknesses of at least one film layer in the drawings of some embodiments of the present disclosure are amplified and do not represent actual dimensions and/or ratios unless otherwise specified.

taking advantage of flexibility and bendability of a display panel of a display device, a bending structure is able to be formed at the edge of the display panel, and a three dimensions (3D) cover plate may be disposed outside the display panel. In this way, it is conducive to realizing an effect of narrow border and full screen display of the display device. The display panel includes a flat region and a bending region after being bent. As shown in FIG. 1, the display panel includes a first film layer 20' for emitting light and a second film layer 30' covered on the first film layer 20', and a thickness of the second film layer 30' is uniform. After the display panel is bent, the light emitted from the bending region of the first film layer 20' vertically enters the portion of the second film layer 30' corresponding to the bending region. Since two surfaces, i.e., an upper surface and a lower surface of the portion of the second film layer 30' corresponding to the bending region are cambered surfaces and parallel to each other, the light will not be deflected and will continue to be vertically emitted. The manner that the light is vertically emitted is as shown by arrowed lines in FIG. 1. Herein, the above two cambered surfaces that are parallel to each other mean that two cambered surfaces having the same or approximate curvature, and the spacing between the two is the same at different positions. Since the direction in which the light is emitted from the bending region points to a direction away from the flat region in the middle of the display panel, when the viewer faces the display panel to view an image, the viewer is likely to have a difference in viewing angle when viewing the bending region relative to viewing the flat region, which causes a difference between the image color of the bending region and the image color of the flat region in the middle when the viewer views an image. As a result, there is a color cast in the image of the bending region that the viewer views when the viewer views the display panel, thereby affecting the display effect of the display panel.

Figure 2:
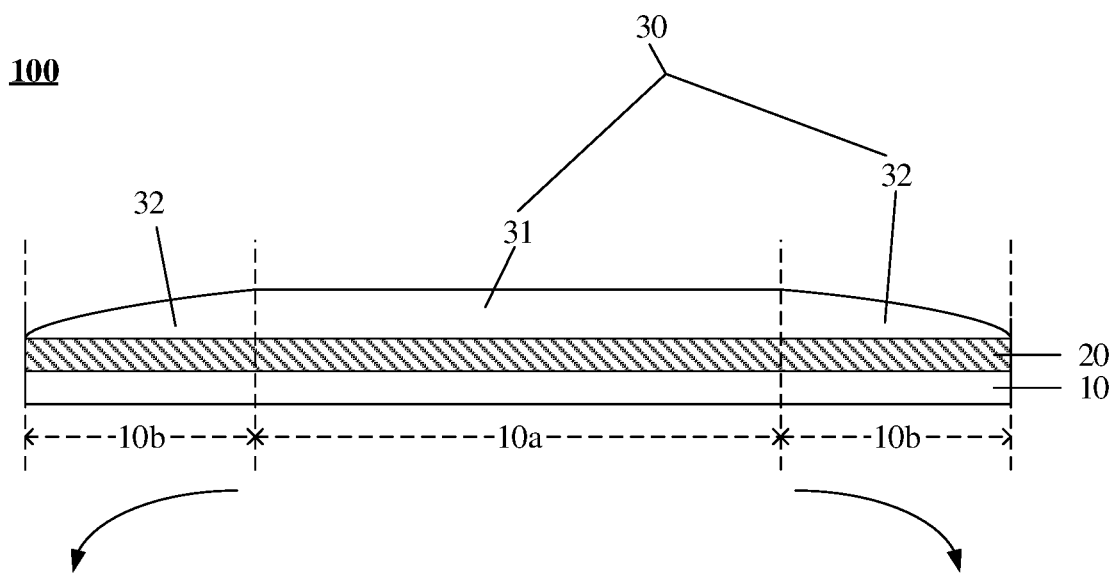
FIG. 2 is a schematic diagram showing a structure of a display panel before being bent, according to some embodiments of the present disclosure.

As shown in FIG. 2, some embodiments of the present disclosure provide a display panel 100, and the display panel 100 includes: a flexible substrate 10, a display layer 20 located at a side of the flexible substrate 10, and a transparent cover film layer 30 located at a side of the display layer 20 away from the flexible substrate 10.

Optionally, the flexible substrate 10 includes: a flexible base and a thin film transistor (TFT) array layer located on the flexible base. The TFT array layer is composed of a plurality of TFTs arranged in an array. A structure and an arrangement manner of the TFTs may be set according to actual needs, which is not limited in some embodiments of the present disclosure.

Figure 3:
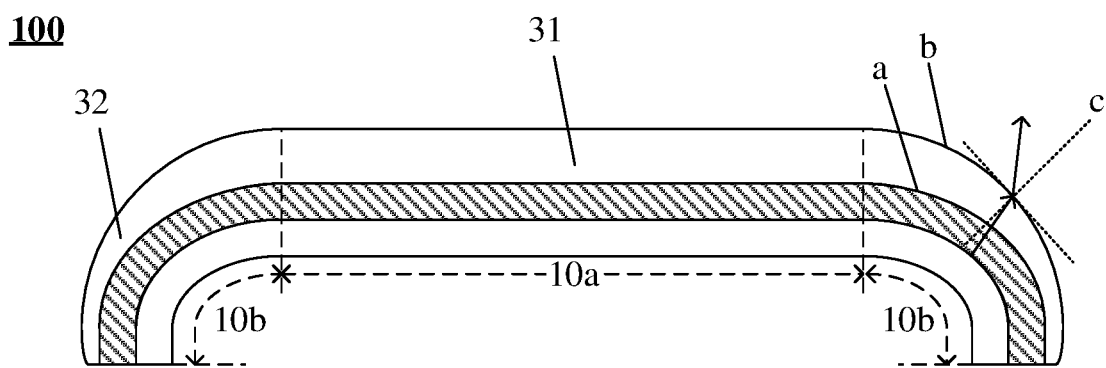
FIG. 3 is a schematic diagram showing a structure of a display panel after being bent, according to some embodiments of the present disclosure.

The flexible substrate 10 includes an intermediate region 10a and a preset bending region 10b located at at least one side of a periphery of the intermediate region 10a. The preset bending region 10b is configured to be bendable toward a direction away from the display layer 20 (as shown by the direction of arrowed lines in FIG. 2). That is, when the viewer faces the display panel 100 to view a display image (i.e., the viewer is closer to the transparent cover film layer 30 than the flexible substrate 10), the preset bending region 10b is bendable toward a direction away from the viewer (the bent display panel 100 is as shown in FIG. 3).

A bending degree of the preset bending region 10b can be flexibly set according to the design requirements of the display panel 100, which is not limited in the embodiment of the present disclosure.

In some embodiments, the display layer 20 located at a side of the flexible substrate 10 and the transparent cover film layer 30 both have bendability to achieve the bendability of the display panel 100 as a whole. In a case where the preset bending region 10b of the flexible substrate 10 is configured to be bendable toward a direction away from the display layer 20, both the display layer 20 and the transparent cover film layer 30 are bendable toward a direction proximate to the flexible substrate 10, that is, bending directions of the flexible substrate 10, the display layer 20 and the transparent cover film layer 30 are the same, thereby making at least one side of the display panel 100 proximate to an edge present a bending state.

The display panel 100 shown in FIG. 2 is illustrated by taking an example in which the preset bending region 10b is located at two opposite sides of a periphery of the intermediate region 10a. That is, a portion of the preset bending region 10b is located at one of the two opposite sides, and the remaining portion is located at the other of the two opposite sides. Of course, the preset bending region 10b may also be located at any one side, any two sides (for example, at two opposite sides or two adjacent sides), any three sides of a periphery of the intermediate region 10a, or at four sides of the intermediate region 10a. A specific position of the preset bending region 10b may be flexibly adjusted in the actual implementation according to the design requirements of the display panel 100, which is not limited in the embodiments of the present disclosure.

The transparent cover film layer 30 includes: a first portion 31 located at a side of the display layer 20 away from the intermediate region 10a, and a second portion 32 located at a side of the display layer 20 away from the preset bending region 10b. Herein, the side of the display layer 20 away from the intermediate region 10a means that a side of a portion of the display layer 20 facing the intermediate region 10a away from the intermediate region 10a, that is, an orthographic projection of the first portion 31 on the display layer 20 is overlapped with an orthographic projection of the intermediate region 10a on the display layer 20. The side of the display layer 20 away from the preset bending region 10b means that a side of a portion of the display layer 20 facing the bending region 10b away from the bending region 10b, that is, an orthographic projection of the second portion 32 on the display layer 20 is overlapped with an orthographic projection of the preset bending region 10b on the display layer 20.

The first portion 31 is connected to the second portion 32. It will be understood that, the transparent cover film layer 30 is an entire film layer, and the connection of the first portion 31 to the second portion 32 means that the region of the first portion 31 that is opposite to the second portion 32 is connected to the second portion 32, and the region of the second portion 32 that is opposite to the first portion 31 is connected to the first portion 31.

Figure 4:
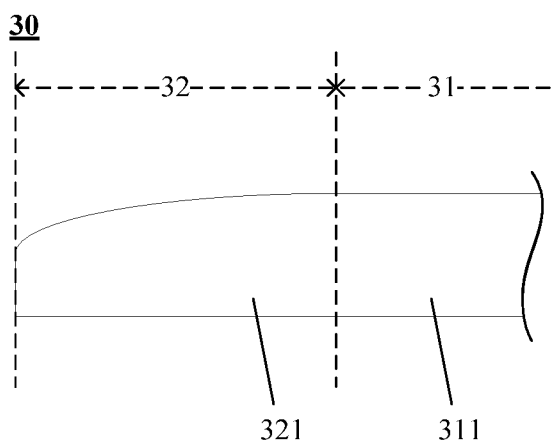
FIG. 4 is a schematic diagram showing a structure of a transparent cover film layer in the display panel shown in FIG. 2.
Figure 5:
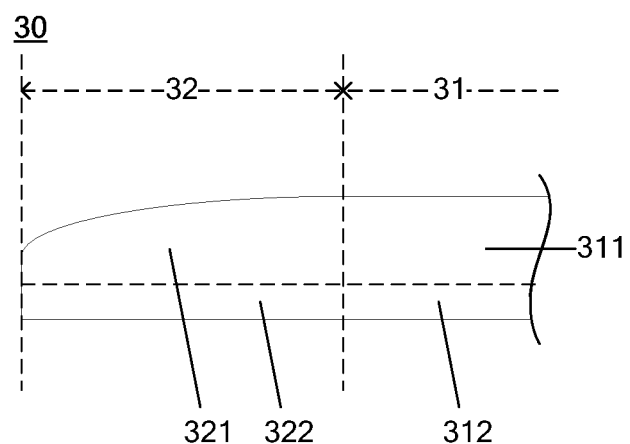
FIG. 5 is a schematic diagram showing a structure of another transparent cover film layer in the display panel shown in FIG. 2.

A thickness of at least partial region of the second portion 32 progressively decreases in a direction away from the first portion 31. Optionally, as shown in FIG. 4, a thickness of a partial region of the second portion 32 progressively decreases in a direction away from the first portion 31, and thicknesses of remaining regions are uniform. Or as shown in FIG. 5, a thickness of the second portion 32 progressively decreases from the position where the second portion 32 is connected to the first portion 31 in a direction away from the first portion 31.

Herein, the thickness of the second portion 32 and an extent to which the thickness thereof progressively decreases (i.e., an oblique degree of a surface b relative to a surface a in FIG. 3) can be calculated according to a preset bending degree of the bending region 10b in the display panel 100, which is not limited in the embodiment of the present disclosure.

The transparent cover film layer 30 is located at a side of the display layer 20 away from the flexible substrate 10, The display layer 20 is configured to provide light for image display. The transparent cover film layer 30 is a light transmissive film layer (for example, made of a transparent or nearly transparent material), which can facilitate light emitted from the display layer 20 to pass through the transparent cover film layer 30, so that the viewer can see the display image.

As shown in FIG. 3, after the display panel 100 provided by the embodiments of the present disclosure is bent, the light emitted from the display layer 20 vertically enters the second portion 32 of the transparent cover film layer 30 corresponding to a side of the preset bending region 10b. Since the thickness of the at least partial region of the second portion 32 progressively decreases in a direction away from the first portion 31, the surface (labeled as a in FIG. 3) at a side of the second portion 32 proximate to the display layer 20 is not parallel to the surface (labeled as b in FIG. 3) at a side of the second portion 32 away from the display layer 20. In this way, after the light exited from the display layer 20 to the second portion 32 sequentially passes through the non-parallel surfaces a and b, since the refractive index of the transparent cover film layer 30 is greater than the refractive index of air, and when light is emitted from the surface b, taking the normal line (labeled as c in FIG. 3) as a reference, an refraction angle is greater than an incident angle, the emitted light is deflected toward a direction biased toward the intermediate region 10a (i.e., a positive direction of a screen), and the manner that the light is deflected is shown by the arrowed lines in FIG. 3, thereby reducing the difference in viewing angle caused by the viewer viewing the preset bending region when facing the display panel, and further effectively reduce a degree of the color cast of the image of the bending region viewed by the viewer when facing the display panel, and improving the display effect of the display panel.

In the display panel 100 provided by the embodiments of the present disclosure, the light emitted from a portion of the display layer 20 corresponding to the preset bending region 10b is deflected toward a space where the intermediate region 10a is located in, after being exited through the second portion 32. This light can also play a role in supplementing the light exited from a portion of the display panel 100 corresponding to the intermediate region 10a, thereby increasing the luminance of the display panel 100.

In the display panel 100 provided by the embodiments of the present disclosure, the thickness of the at least partial region of the second portion proximate to the edge progressively decreases, so as to form a thinned structure, and the thinned structure may also have an effect on facilitating the bending of the display panel 100.

In some embodiments, the display panel 100 further includes a cover plate located at a side of the transparent cover film layer 30 away from the display layer 20, so as to protect the layers in the display panel 100.

The structure and material of the cover plate can be selected according to actual needs, as long as the refractive index of the cover plate is less than the refractive index of the transparent cover film layer 30. Optionally, a material of the cover plate is a flexible material, in this way, the cover plate may be bent together with the bending of the transparent cover film layer 30, the display layer 20, and the flexible substrate 10. Alternatively, a material of the cover plate is a rigid material (for example, cover glass), and the portion of the cover plate corresponding to the preset bending region 10b has a corresponding bending structure, a bending degree of which matches a bending degree of each of the transparent cover film layer 30, the display layer 20, and the flexible substrate 10, so that the cover plate may be bonded to a side of the transparent cover film layer 30 away from the display layer 20 after the above layers are bent.

Referring to FIGS. 2 and 3, in some embodiments, the thickness of the second portion 32 progressively decreases from the position where the second portion 32 is connected to the first portion 31 in a direction away from the first portion 31, thereby it can be ensured that the whole surface b at a side of the second portion 32 away from the display layer 20 and the surface a at a side of the second portion 32 proximate to the display layer 20 are not parallel, so that more light emitted from the portion of the display layer 20 corresponding to the preset bending region 10b is deflected toward a direction biased toward a space where the intermediate region 10a is located in. In addition, an area of the preset bending region 10b in the flexible substrate 10 is generally small, and an area of the second portion 32 facing the preset bending region 10b is also small, therefore, the overall thickness of the second portion 32 is configured to progressively decrease from the position where the second portion 32 is connected to the first portion 31 in a direction away from the first portion 31, which is also conductive to obtaining an area as large as possible for manufacturing a special-shaped region (i.e., non-flat region) in the process of manufacturing the second portion 32 of the transparent cover film layer 30, thereby facilitating the manufacturing of the transparent cover film layer 30 and reducing the process difficulty.

With continued reference to FIGS. 2 and 3, in some embodiments, the thickness of the first portion 31 is set to be a uniform thickness, which can prevent the display effect from being affected due to an uneven thickness of the first portion 31 when the display layer 20 emits light from the flat intermediate region 10a. Optionally, the second portion 32 is configured such that the thickness of the position where the second portion 32 is connected to the first portion 31 is equal to the thickness of the first portion 31, that is, the transparent cover film layer 30 has a smoothly varying structure that is thick in the middle and thin proximate to the edge is formed, so as to facilitate the manufacturing of the transparent cover film layer 30, and reduce the process difficulty.

It will be understood that, the thickness of the position where the second portion 32 is connected to the first portion 31 is equal to the thickness of the first portion 31, thereby, the transparent cover film layer 30 has a smoothly varying structure from the first portion 31 having a uniform thickness to the second portion 32 having a progressively decreasing thickness.

Figure 6:
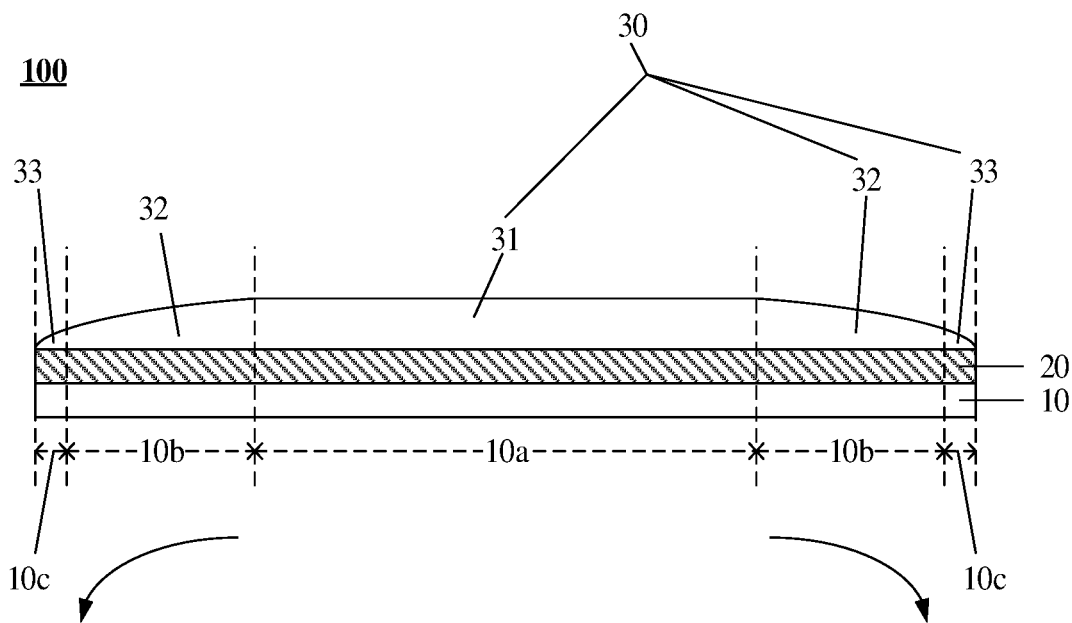
FIG. 6 is a schematic diagram showing a structure of another display panel before being bent, according to some embodiments of the present disclosure.
Figure 7:
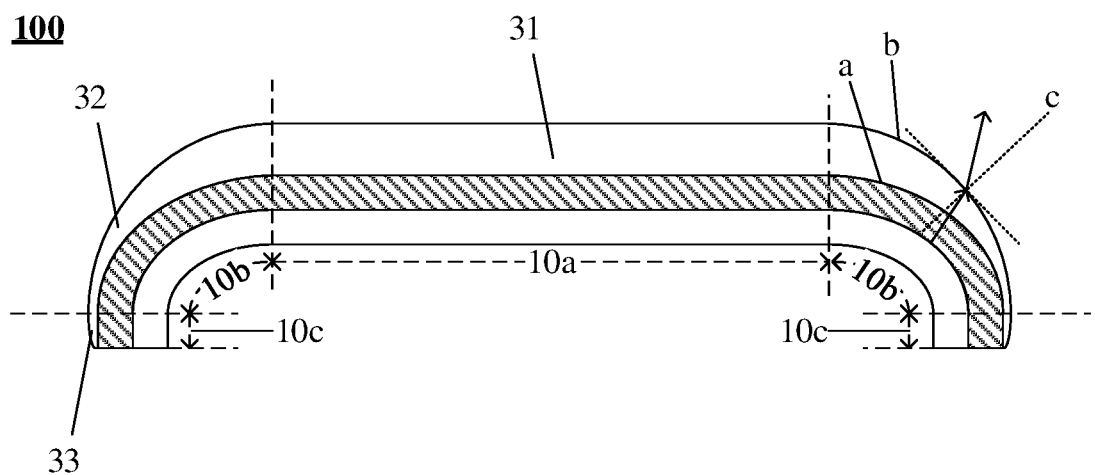
FIG. 7 is a schematic diagram showing a structure of another display panel after being bent, according to some embodiments of the present disclosure.

As shown in FIGS. 6 and 7, the flexible substrate 10 further includes an edge region 10c located at a side of the preset bending region 10b away from the intermediate region 10a. The transparent cover film layer 30 further includes a third portion 33 located at a side of the display layer 20 away from the edge region 10c. Herein, the side of the display layer 20 away from the edge region 10c means that a side of the portion of the display layer 20 facing the edge region 10c away from the edge region 10c. That is, an orthographic projection of the third portion 33 on the display layer 20 is overlapped with an orthographic projection of the edge region 10c on the display layer 20.

It will be understood that, the transparent cover film layer 30 is an entire film layer, and the connection of the third portion 33 to the second portion 32 means that the region of the third portion 33 that is opposite to the second portion 32 is connected to the second portion 32, and the region of the second portion 32 that is opposite to the third portion 33 is connected to the third portion 33.

Figure 8:
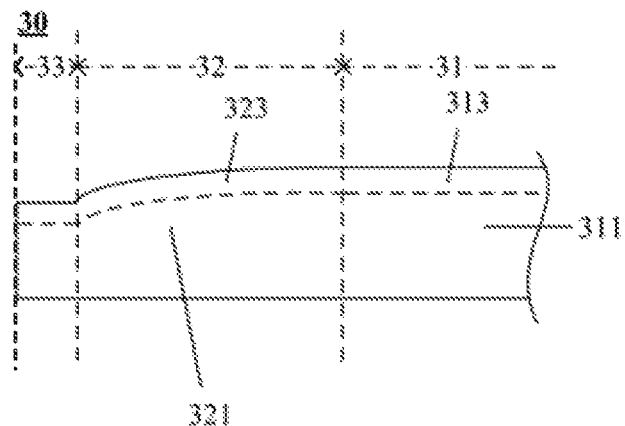
FIG. 8 is a schematic diagram showing a structure of a transparent cover film layer in the display panel shown in FIG. 6.
Figure 9:
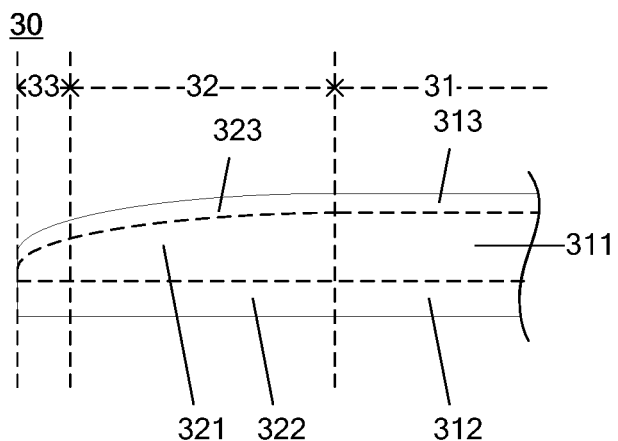
FIG. 9 is a schematic diagram showing a structure of another transparent cover film layer in the display panel shown in FIG. 6.

In some embodiments, a thickness of the third portion 33 can be flexibly set according to the actual needs of the display panel 100. Optionally, as shown in FIG. 8, the thickness of the third portion 33 is set to be a uniform thickness, and the thickness of the third portion 33 is equal to the thickness of the second portion 32 at a position where the third portion 33 is connected to the second portion 32, that is, the thickness of the third portion 33 is equal to the minimum thickness to which the thickness of the second portion 32 progressively decreases. Alternatively, as shown in FIG. 9, the thickness of the third portion 33 is configured to progressively decrease from the position where the third portion 33 is connected to the second portion 32 in a direction away from the second portion 32, that is, the thickness of the third portion 33 exhibits a smoothly decreasing form, so as to facilitate the manufacturing of the transparent cover film layer 30 and reduce the process difficulty.

Figure 16:
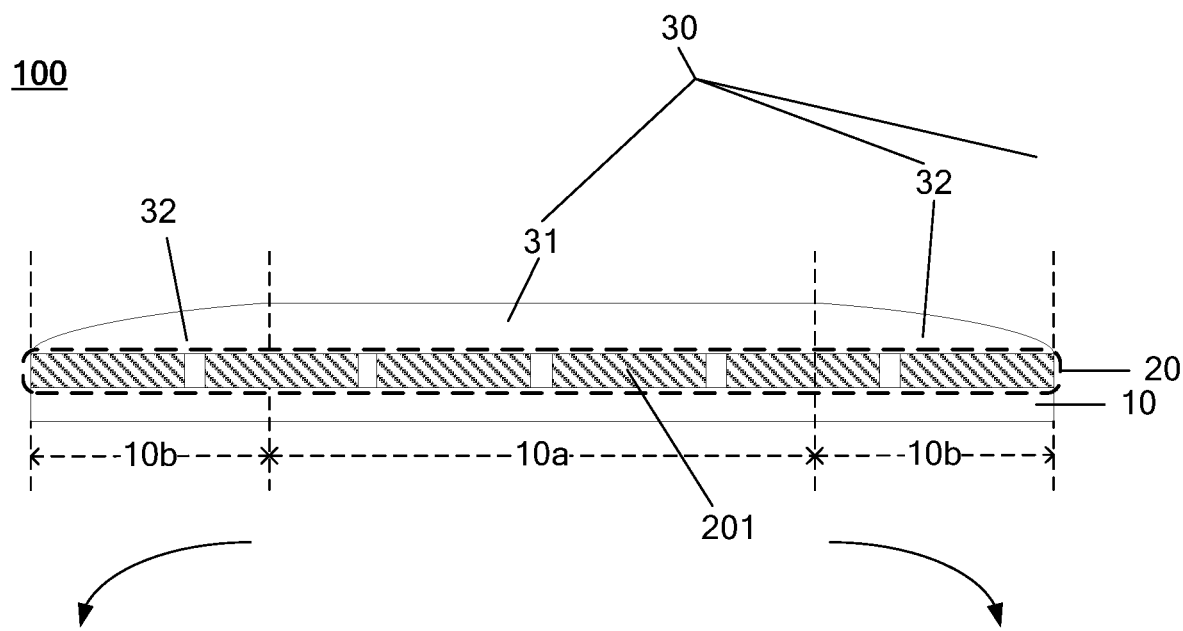
FIG. 16 is a schematic diagram showing a structure of yet another display panel, according to some embodiments of the present disclosure.

In some embodiments, as shown in FIG. 16, the display layer 20 includes a plurality of light-emitting devices 201. For example, each of the plurality of light-emitting devices is a top-emitting light-emitting device.

Figure 17:
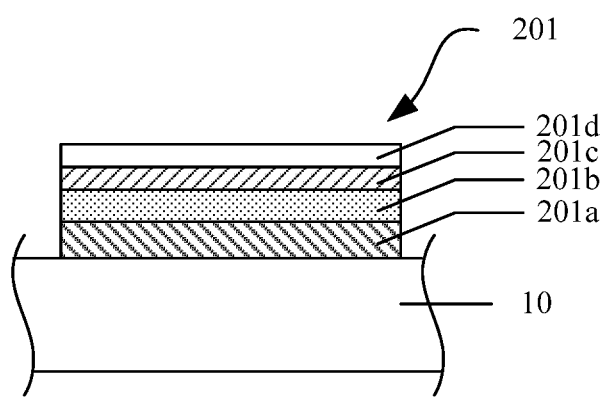
FIG. 17 is an enlargement schematic diagram showing a structure of a top-emitting light-emitting device shown in FIG. 16.

The structure of the top-emitting light-emitting device can be various, which is not limited in the embodiments of the present disclosure. Optionally, the top-emitting light-emitting device is a top-emitting OLED device, as shown in FIG. 17, which includes a reflective electrode 201a, a light-emitting functional layer 201b, a transmissive electrode 201c, and a capping layer 201d which are disposed sequentially away from the flexible substrate 10. Herein, the top-emitting means that the light emitted from the light-emitting device does not pass through the flexible substrate 10, but passes through an electrode (i.e., the transmissive electrode) at a side away from the flexible substrate 10.

The reflective electrode is used as an anode, which includes a metal layer (e.g., Ag) and a high work function layer (e.g., indium tin oxide, as abbreviated ITO) that are disposed in a stack. That is, the structure of the reflective electrode is generally stacked (such as an Ag/ITO stacked structure), in which the metal layer (e.g., Ag) having a high reflectance is disposed further away from the light-emitting functional layer, and the ITO layer having a high work function is disposed closer to the light-emitting functional layer, in order to improve the injection efficiency of holes.

The light-emitting functional layer includes a hole injection layer (HIL), a hole transportation layer (HTL), an emission layer (EL), and an electron transportation layer (ETL), and an electron injection layer (EIL), which are disposed sequentially away from the reflective electrode.

The transmissive electrode is used as a cathode and is made of a metal material (e.g., Li, Mg, etc.) having a low work function, in order to improve the injection efficiency of electrons. A thickness of the transmissive electrode is small to achieve translucency so that light can be transmitted through the transmissive electrode smoothly.

A capping layer (CPL) is located at a side of the transmissive electrode away from the light-emitting functional layer to increase the light output rate. The material of the CPL is generally an organic material having a large refractive index and a small absorption coefficient.

In some embodiments, the transparent cover film layer 30 is used as a thin film encapsulation (TFE) layer, and the thin film encapsulation layer is configured to encapsulate the plurality of light-emitting devices, so as to prevent the light-emitting devices from being eroded by water and oxygen, which has an adverse effect on the light-emitting properties of the light-emitting devices, thereby, the color cast phenomenon after the display panel 100 is bent may be improved while the light-emitting devices are encapsulated and protected.

The structure of the transparent cover film layer 30 can be various. In some embodiments, the first portion 31 includes at least one film layer disposed in a stack, and the second portion 32 includes at least one film layer that is connected in one-to-one correspondence to the at least one film layer of the first portion 31. The thickness of at least partial region of the at least one film layer of the second portion 32 progressively decreases in a direction away from the first portion.

For example, the transparent cover film layer 30 includes a single layer. As shown in FIG. 4, the first portion 31 includes a first organic layer 311, and the second portion 32 includes a second organic layer 321. The first organic layer 311 is connected to the second organic layer 321, and a thickness of at least partial region of the second organic layer 321 progressively decreases in a direction away from the first organic layer 311. Herein, the first organic layer 311 and the second organic layer 321 constitute an entire organic layer.

For example, the transparent cover film layer 30 includes a plurality of layers. In a case where the transparent cover film layer 30 is used as a thin film encapsulation layer, by using the transparent cover film layer 30 having a structure of a plurality of layers, the erosion of the light-emitting devices by water and oxygen can be more effectively prevented to improve the encapsulation effect of the transparent cover film layer 30.

Optionally, referring to FIGS. 2 and 5, the first portion 31 includes a first inorganic layer 312 and a first organic layer 311 which are sequentially disposed in a stack in a direction away from the flexible substrate 10. The second portion 32 includes a second inorganic layer 322 and a second organic layer 321 which are sequentially disposed in a stack in a direction away from the flexible substrate 10. Herein, the first organic layer 311 is connected to the second organic layer 321 to constitute an entire organic layer, and the first inorganic layer 312 is connected to the second inorganic layer 322 to constitute an entire inorganic layer.

The thickness of at least partial region of the second organic layer 321 progressively decreases in a direction away from the first organic layer 311, so as to make the organic layer easier to obtain a structure with progressively decreasing thickness by adjusting the manufacturing process, so as to reduce the difficulty of the manufacturing process. In addition, thicknesses of the first inorganic layer 312 and the second inorganic layer 322 are set to be the same, which simplifies the manufacturing process.

In a case where the transparent cover film layer 30 is used as a thin film encapsulation layer, the transparent cover film layer 30 has a structure in which an inorganic layer and an organic layer are sequentially disposed in a stack in a direction away from the flexible substrate 10, which can effectively improve the ability of the transparent cover film layer 30 to block the erosion of water and oxygen as a whole. Of course, it is also possible that the transparent cover film layer 30 has a structure in which an organic layer and an inorganic layer are sequentially disposed in a stack in a direction away from the flexible substrate 10.

Optionally, referring to FIGS. 2 and 8, the first portion 31 includes a first organic layer 311 and a third inorganic layer 313 which are sequentially disposed in a stack in a direction away from the flexible substrate 10. The second portion 32 includes a second organic layer 321 and a fourth inorganic layer 323 which are sequentially disposed in a stack in a direction away from the flexible substrate. The first organic layer 311 is connected to the second organic layer 321 to constitute an entire organic layer, and the thickness of at least partial region of the second organic layer 321 progressively decreases in a direction away from the first organic layer 311. The third inorganic layer 313 is connected to the fourth inorganic layer 323 to constitute an entire inorganic layer, and thicknesses of the two are the same to simplify the manufacturing process.

It will be noted that, the thickness of the fourth inorganic layer 323 should be as thin as possible so that after the fourth inorganic layer 323 is covered on the second organic layer 321, the thickness of the third inorganic layer 313 does not affect the second portion 32 achieving the effect that the thickness of at least partial region progressively decreases in a direction away from the first portion 31.

Optionally, referring to FIGS. 2 and 9, the first portion 31 includes a first inorganic layer 312, a first organic layer 311, and a third inorganic layer 313 which are sequentially disposed in a stack in a direction away from the flexible substrate 10. The second portion 32 includes a second inorganic layer 322, a second organic layer 321, and a fourth inorganic layer 323 which are sequentially disposed in a stack in a direction away from the flexible substrate 10. The first inorganic layer 312 is connected to the second inorganic layer 322 to constitute an entire inorganic layer. The first organic layer 311 is connected to the second organic layer 321 to constitute an entire organic layer, and the thickness of at least partial region of the second organic layer 321 progressively decreases in a direction away from the first organic layer 311. The third inorganic layer 313 is connected to the fourth inorganic layer 323 to constitute an entire inorganic layer, and thicknesses of the two are the same to simplify the manufacturing process. Herein, the transparent cover film layer 30 has a stacked structure of an inorganic layer/an organic layer/another inorganic layer, and in a case where the transparent cover film layer 30 is used as a thin film encapsulation layer, the ability of the transparent cover film layer 30 to block the erosion of water and oxygen as a whole can be improved.

The material for forming any one of the first inorganic layer 312, the second inorganic layer 322, the third inorganic layer 313 or the fourth inorganic layer 323 may include a structurally dense silicon nitride ($SiN_x$), a structurally dense silicon oxide ($SiO_2$), a structurally dense silicon oxynitride (SiON) or the other inorganic material, for example, aluminium oxide ($AlO_x$). The material for forming the first organic layer 311 or the second organic layer 321 includes an acrylic-based polymer, a silicon-based polymer or an epoxy-based polymer, etc., which is not limited in some embodiments of the present disclosure.

In a case where the transparent cover film layer 30 further includes the third portion 33, a structure of the third portion 33 is matched with a structure of the second portion 32, and in a process of forming the inorganic layer(s) and the organic layer of the second portion, the inorganic layer(s) and the organic layer of the third portion 33 will be correspondingly formed, which will not be described herein again.

Figure 10:
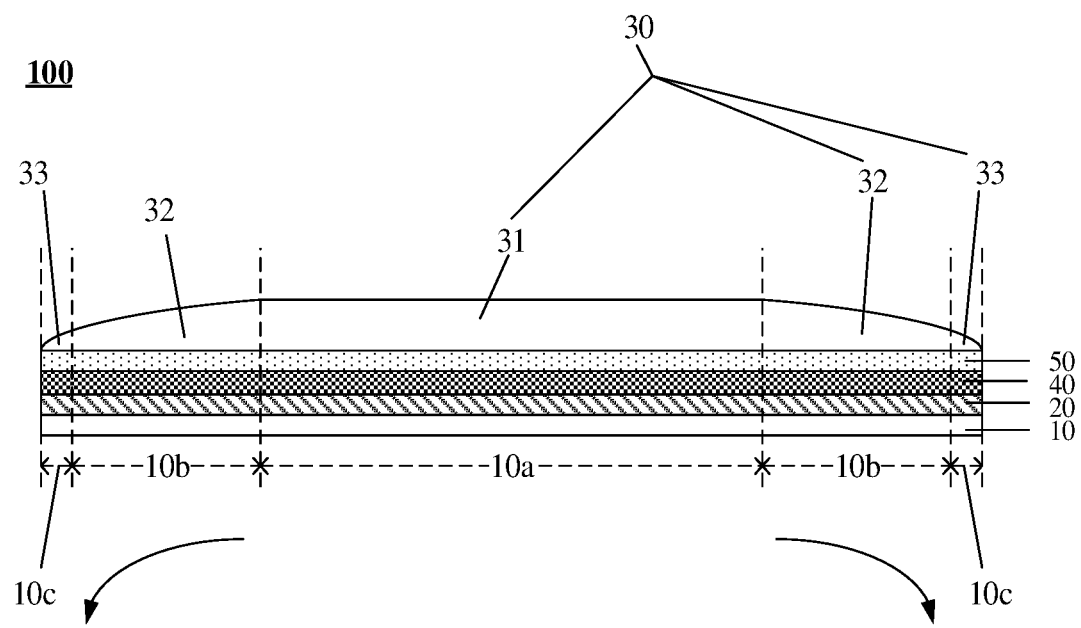
FIG. 10 is a schematic diagram showing a structure of yet another display panel, according to some embodiments of the present disclosure.

Referring to FIGS. 10 and 16, in some embodiments, the display layer 20 includes a plurality of light-emitting devices 201, and a thin film encapsulation layer 40 and a bonding layer 50 that are both located between the display layer 20 and the transparent cover film layer 30. The thin film encapsulation layer 40 is configured to encapsulate the plurality of light-emitting devices 201, and the bonding layer 50 is configured to bond the thin film encapsulation layer 40 and the transparent cover film layer 30.

Herein, the light-emitting device is, for example, a top-emitting light-emitting device. The structure of the top-emitting light-emitting device refers to the above description, which will not be described herein again. The thin film encapsulation layer 40 is an encapsulation layer having a uniform thickness, the structure of which is not limited in some embodiments of the present disclosure.

The bonding layer 50 is made of an adhesive material with high light transmittance. Optionally, the adhesive material of the bonding layer 50 is a dam adhesive, and the material of the dam adhesive is, for example, epoxy resin.

Figure 11:
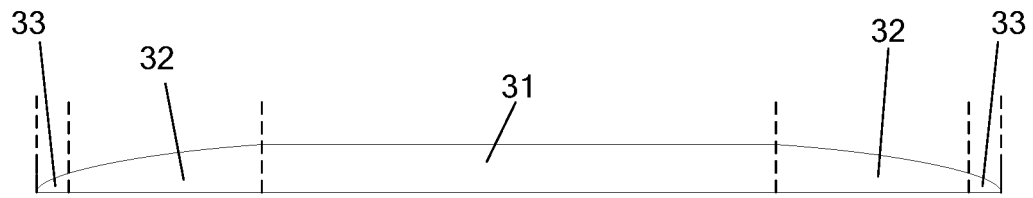
FIG. 11 is a schematic diagram showing a structure of the transparent cover film layer in the display panel shown in FIG. 10.

As shown in FIG. 11, the transparent cover film layer 30 is, for example, a thin film having a shape capable of deflecting the light passing through the second portion 32 of the thin film toward the direction of the first portion 31. The transparent cover film layer 30 includes a first portion 31, a second portion 32, and a third portion 33, each of which may have a structure with a single layer or a plurality of layers.

The specific structure of the transparent cover film layer 30 can refer to the above description, which will not be described herein again.

As shown in FIG. 10, the transparent cover film layer 30 as shown in FIG. 11 is bonded to the thin film encapsulation layer 40 in the display panel 100 through the bonding layer 50, that is, further encapsulation of the display layer 20 is achieved by using, for example, an manner that the dam adhesive and the thin film are combined (i.e., Dam+Thin Film), thereby improving the ability of the display layer 20 to block the erosion of water and oxygen in the environment to ensure that the display layer 20 has good display properties.

Figure 12:
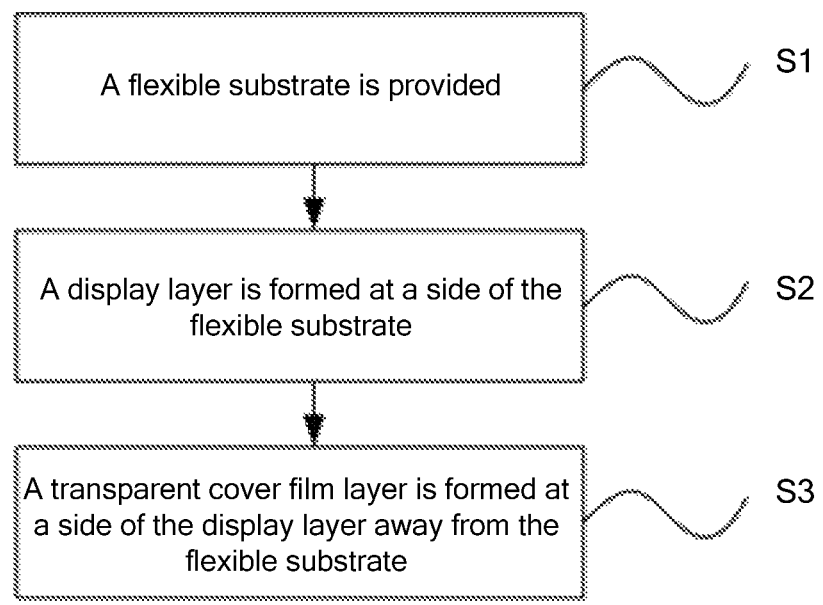
FIG. 12 is a flow diagram of a method of manufacturing a display panel, according to some embodiments of the present disclosure.

As shown in FIG. 12, some embodiments of the present disclosure further provide a method of manufacturing a display panel. The method includes step 1 (S1) to step 3 (S3).

In S1, a flexible substrate 10 is provided.

In S2, a display layer 20 is formed at a side of the flexible substrate 10.

In S3, a transparent cover film layer 30 is formed at a side of the display layer 20 away from the flexible substrate 10.

The provided flexible substrate 10 includes: an intermediate region 10a and a preset bending region 10b located at at least one side of a periphery of the intermediate region 10a. The preset bending region 10b is configured to be bendable toward a direction away from the display layer 20. The formed transparent cover film layer 30 includes: a first portion 31 located at a side of the display layer 20 away from the intermediate region 10a, and a second portion 32 located at a side of the display layer 20 away from the preset bending region 10b. The first portion 31 is connected to the second portion 32, and the thickness of at least partial region of the second portion 32 progressively decreases in a direction away from the first portion 31.

The beneficial effect of the manufactured display panel 100 can refer to the description in some embodiments of the display panel 100 described above, which will not be described herein again.

In some embodiments, a thickness of the second portion 32 formed in S3 progressively decreases from the position where the second portion 32 is connected to the first portion 31 in a direction away from the first portion 31. The area of the preset bending region 10b in the flexible substrate 10 is generally small, and the area of the second portion 32 facing the preset bending region 10b is also small, therefore, the overall thickness of the second portion 32 decreases progressively from the position where the second portion 32 is connected to the first portion 31 in a direction away from the first portion 31, which is conductive to obtaining an area as large as possible for manufacturing a special-shaped region (i.e., non-flat region) in the process of manufacturing the second portion 32 of the transparent cover film layer 30, thereby facilitating the manufacturing of the transparent cover film layer 30 and reducing the process difficulty.

In some embodiments, S3 includes step 32 (S32), in which by using an inkjet printing process, a first organic layer 311 is formed at a side of the display layer 20 away from the intermediate region 10a, and a second organic layer 321 is formed at a side of the display layer 20 away from the preset bending region 10b. The first organic layer 311 is connected to the second organic layer 321.

In the process of forming the second organic layer 321, the thickness of at least partial region of the second organic layer 321 progressively decreases in a direction away from the first organic layer 311 by adjusting process parameters of the inkjet printing process. Optionally, S32 includes: the overall thickness the formed second organic layer 321 progressively decreases from a position where the formed second organic layer 321 is connected to the first organic layer 311 in a direction away from the formed first organic layer 311 by adjusting the process parameters of the inkjet printing process, so as to facilitate the manufacturing of the second organic layer 321.

The above process parameters include an output amount of the inkjet printing material and/or a residence time of the inkjet printing. A structure in which the thickness of the transparent cover film layer 30 progressively and smoothly decreases from the middle to the bending region proximate to the edge is realized by adjusting the above process parameters.

For example, in a case where the printing of the transparent cover film layer 30 is performed in a direction from the intermediate region 10a to the outer preset bending region 10b by using the inkjet printing process, in the process of manufacturing the transparent cover film layer 30, the output amount of the inkjet printing material and/or the residence time of the inkjet printing may be progressively reduced when the material to be printed is ejected to an intersection of the intermediate region 10a and the preset bending region 10b, so that a structure in which the thickness of the second organic layer 321 progressively decreases from the position where the second organic layer 321 is connected to the first organic layer 311 in a direction away from the first organic layer 311 can be formed.

For example, in a case where the printing of the transparent cover film layer 30 is performed in a direction from the preset bending region 10b to the inner intermediate region 10a by using the inkjet printing process, in the process of manufacturing the transparent cover film layer 30, the output amount of the inkjet printing material and/or the residence time of the inkjet printing may be progressively increased when the material to be printed is ejected to the outermost boundary of the preset bending region 10b away from the intermediate region 10a is manufactured, so that the structure in which the thickness of the second organic layer 321 progressively decreases from the position where the second organic layer 321 is connected to the first organic layer 311 in a direction away from the first organic layer 311 can be formed.

Figure 13:
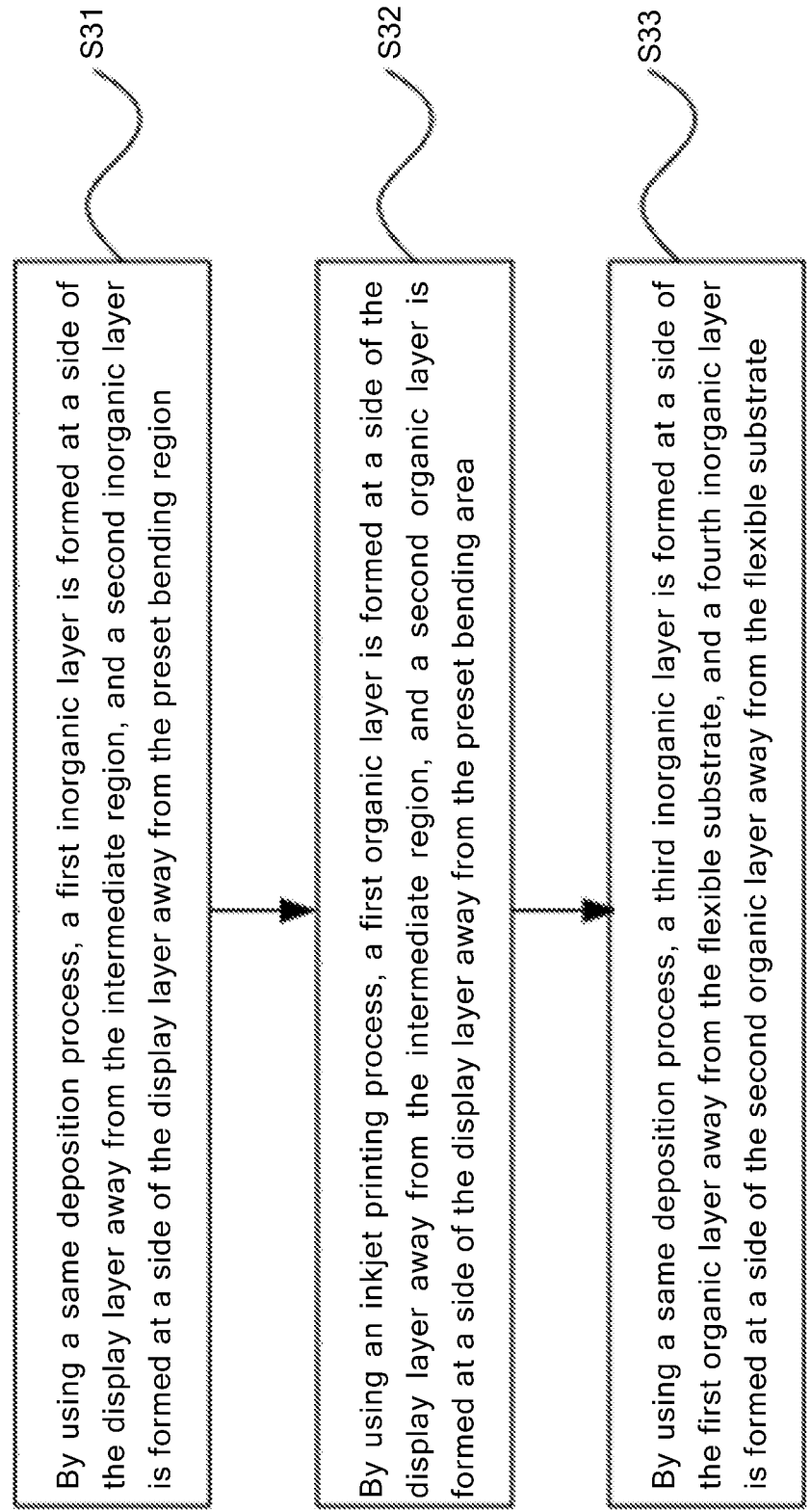
FIG. 13 is a flow diagram of a method of manufacturing a transparent cover layer, according to some embodiments of the present disclosure.

As shown in FIG. 13, in some embodiments, S3 further includes step 31 (S31) and/or step 33 (S33).

In S31, before a step of forming the first organic layer 311 and the second organic layer 321, by using a same deposition process, a first inorganic layer 312 is formed at a side of the display layer 20 away from the intermediate region 10a, and a second inorganic layer 322 is formed at a side of the display layer 20 away from the preset bending region 10b. The first inorganic layer 312 and the second inorganic layer 322 are connected to each other and have the same thickness, and the two constitute an integral structure.

The deposition process is, for example, a deposition method such as chemical vapor deposition (CVD).

In S33, after a step of forming the first organic layer 311 and the second organic layer 321, by using a same deposition process, a third inorganic layer 313 is formed at a side of the first organic layer 311 away from the flexible substrate 10, and a fourth inorganic layer 323 is formed at a side of the second organic layer 321 away from the flexible substrate 10. The third inorganic layer 313 and the fourth inorganic layer 323 are connected to each other and have the same thickness, and the two constitute an integral structure. The deposition process is, for example, a deposition method such as chemical vapor deposition (CVD).

Herein, in a case where the transparent cover film layer 30 further includes the third portion 33, a structure of the third portion 33 is matched with a structure of the second portion 32, and in a process of forming the inorganic layer(s) and the organic layer in the second portion are formed, the inorganic layer(s) and the organic layer in the third portion 33 will be correspondingly formed, and the manufacturing process of the third portion 33 will not be described herein again.

In some embodiments, S2 includes step 21 (S21), in which a plurality of light-emitting devices are formed on the intermediate region 10*a* and the preset bending region 10*b*. The light-emitting devices are, for example, top-emitting light-emitting devices.

Optionally, the top-emitting light-emitting device is a top-emitting OLED device, the manufacturing method of which is: forming a reflective electrode at a side of the flexible substrate 10, and sequentially evaporating a light-emitting functional layer, a transmissive electrode, and a capping layer at a side of the reflective electrode away from the flexible substrate 10. A specific structure of each layer can refer to the above description, which will not be described herein again.

In some embodiments, the transparent cover film layer 30 in the display panel 100 is used as a thin film encapsulation layer. Alternatively a transparent cover film layer 30 and a thin film encapsulation layer 40 are provided in the display panel 100, that is, in some embodiments, the transparent cover film layer 30 and the thin film encapsulation layer 40 are two independent components.

For example, the transparent cover film layer 30 in the display panel 100 functions as a thin film encapsulation layer. Based on this, S3 includes: forming a thin film encapsulation layer at a side of the display layer 20 away from the flexible substrate 10. That is, the transparent cover film layer 30 is used as a thin film encapsulation layer to encapsulate the plurality of light-emitting devices.

Figure 14:
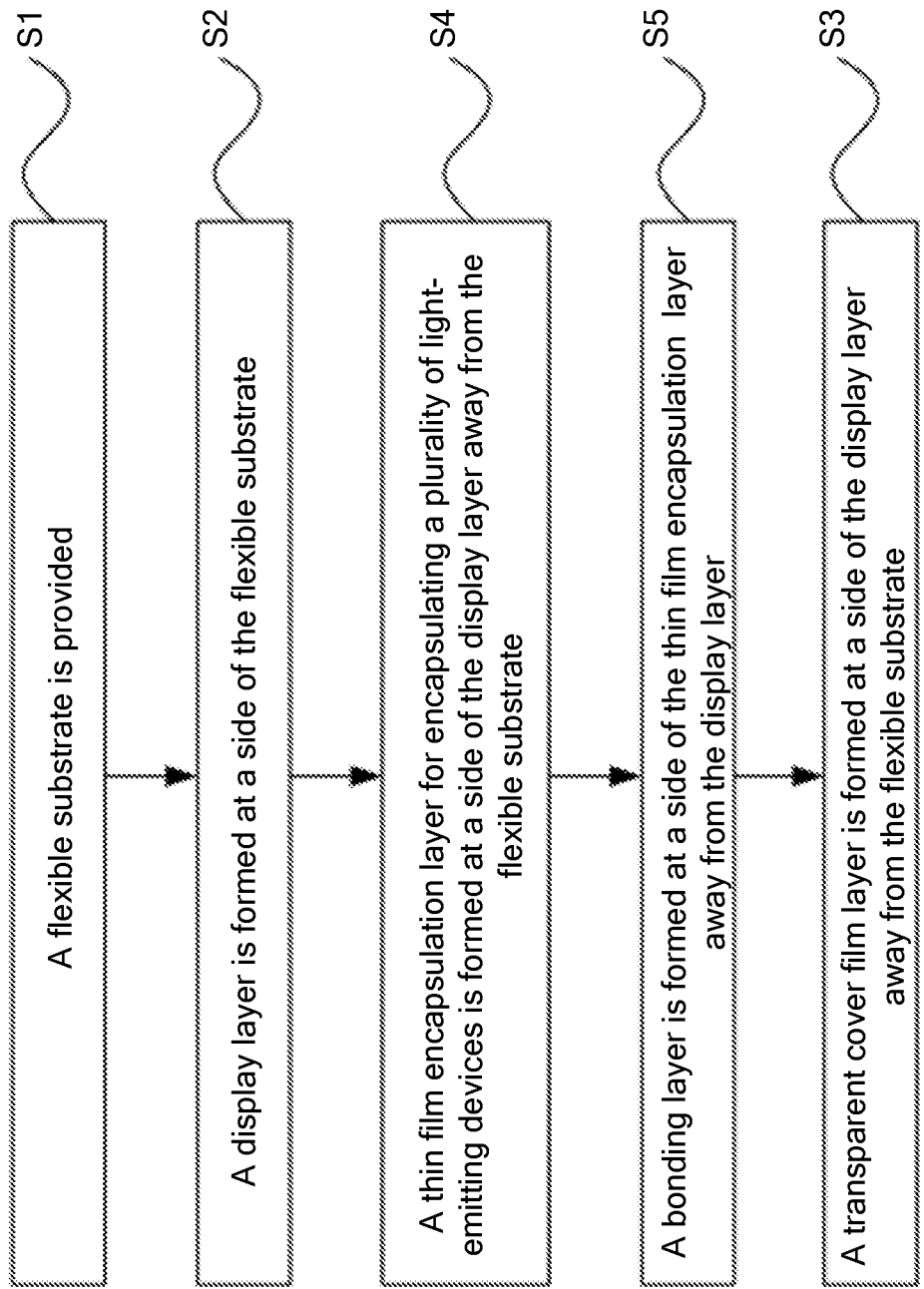
FIG. 14 is a flow diagram of another method of manufacturing a display panel according to some embodiments of the present disclosure.

For example, a transparent cover film layer 30 and a thin film encapsulation layer 40 are provided in the display panel 100. Based on this, as shown in FIG. 14, before S3, the method of manufacturing the above display panel further includes step 4 (S4) to step 5 (S5).

In S4, a thin film encapsulation layer 40 for encapsulating the plurality of light-emitting devices is formed at a side of the display layer 20 away from the flexible substrate 10.

In S5, a bonding layer 50 is formed at a side of the thin film encapsulation layer 40 away from the display layer 20. The bonding layer 50 is configured to bond the thin film encapsulation layer 40 and the transparent cover film layer 30.

Herein, referring to FIG. 11, a thin film having a shape capable of deflecting the light passing through the second portion 32 of the thin film toward the direction of the first portion 31 of the film is formed by processing, and the thin film is used as the transparent cover film layer 30. Then, the transparent cover film layer 30 is bonded to the thin film encapsulation layer 40 in the display panel 100 through the bonding layer 50, that is, further encapsulation of the display layer 20 is achieved by using, for example, an manner that the dam adhesive and the thin film are combined (i.e., Dam+Thin Film), thereby improving the ability of the display layer 20 to block the erosion of water and oxygen in the environment to ensure that the display layer 20 has good display properties.

It will be noted that, in the embodiments of the method of manufacturing the display panel of the present disclosure, the description of structures and beneficial effects of the components in the formed display panel 100 is relatively brief, and the details thereof can refer to the description in the embodiments of the above display panel, which will not be described herein again.

Figure 15:
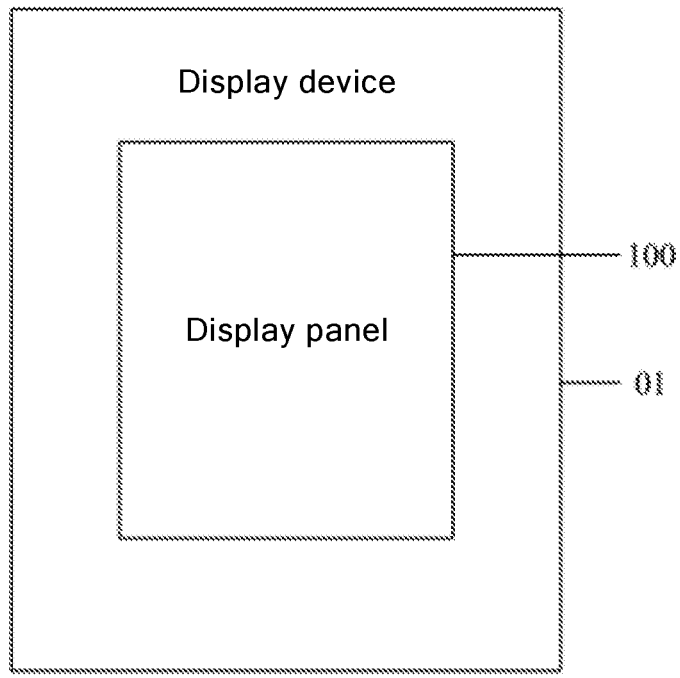
FIG. 15 is a schematic diagram showing a structure of a display device, according to some embodiments of the present disclosure.

As shown in FIG. 15, some embodiments of the present disclosure further provide a display device 01. The display device 01 includes the display panel 100 in any one of the above embodiments.

The display device 01 may be an device or component having a bending display function (i.e., the bending portion being able to display) such as a smart wristband, a smart helmet, a mobile phone, a tablet computer, a television, a display, a notebook computer, a digital photo frame, or a navigator.

In the description of the above embodiments, specific features, structures, materials or characteristics may be combined in an appropriate manner in any one or more embodiments or examples.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
a flexible substrate, wherein the flexible substrate includes an intermediate region and a preset bending region located at at least one side of a periphery of the intermediate region;
a display layer located at a side of the flexible substrate, wherein the display layer includes a plurality of light-emitting devices; each of the plurality of light-emitting devices includes a top-emitting light-emitting device, and the top-emitting light-emitting device includes a reflective electrode, a light-emitting functional layer, a transmissive electrode, and a capping layer that are disposed sequentially away from the flexible substrate; and
a transparent cover film layer located at a side of the display layer away from the flexible substrate, wherein the transparent cover film layer includes a first portion located at a side of the display layer away from the intermediate region, and a second portion located at a side of the display layer away from the preset bending region, wherein
the first portion is connected to the second portion, and a thickness of at least a partial region of the second portion progressively decreases in a direction away from the first portion.

2. The display panel according to claim 1, wherein a thickness of the second portion progressively decreases from a position where the second portion is connected to the first portion in a direction away from the first portion.

3. The display panel according to claim 2, wherein a thickness of the first portion is uniform, and a thickness of the position where the second portion is connected to the first portion is equal to a thickness of the first portion.

4. The display panel according to claim 1, wherein the display layer includes a plurality of light-emitting devices; and
the transparent cover film layer includes a thin film encapsulation layer, and the thin film encapsulation layer is configured to encapsulate the plurality of light-emitting devices.

5. The display panel according to claim 1, wherein the first portion includes at least one film layer disposed in a stack, the second portion includes at least one film layer that is connected in one-to-one correspondence to the at least one film layer of the first portion, wherein
a thickness of at least a partial region of the at least one film layer of the second portion progressively decreases in a direction away from the first portion.

6. The display panel according to claim 5, wherein the first portion includes a first organic layer; and the second portion includes a second organic layer, wherein
the first organic layer is connected to the second organic layer, and a thickness of at least a partial region of the second organic layer progressively decreases in a direction away from the first organic layer.

7. The display panel according to claim 6, wherein the first portion further includes a first inorganic layer located at a side of the first organic layer proximate to the flexible substrate; and
the second portion further includes a second inorganic layer located at a side of the second organic layer proximate to the flexible substrate, wherein
the first inorganic layer is connected to the second inorganic layer, and the first inorganic layer and the second inorganic layer have a same thickness.

8. The display panel according to claim 6, wherein the first portion further includes a third inorganic layer located at a side of the first organic layer away from the flexible substrate; and
the second portion further includes a fourth inorganic layer located at a side of the second organic layer away from the flexible substrate, wherein
the third inorganic layer is connected to the fourth inorganic layer, and the third inorganic layer and the fourth inorganic layer have a same thickness.

9. The display panel according to claim 1, further comprising:
a thin film encapsulation layer and a bonding layer that are both located between the display layer and the transparent cover film layer, wherein
the display layer includes a plurality of light-emitting devices;
the thin film encapsulation layer is configured to encapsulate the plurality of light-emitting devices, and
the bonding layer is configured to bond the thin film encapsulation layer and the transparent cover film layer.

10. The display panel according to claim 1, wherein the flexible substrate further includes an edge region located at a side of the preset bending region away from the intermediate region; and
the transparent cover film layer further includes a third portion located at a side of the display layer away from the edge region, wherein the third portion is connected to the second portion.

11. The display panel according to claim 10, wherein a thickness of the third portion progressively decreases from a position where the third portion is connected to the second portion in a direction away from the second portion; or
a thickness of the third portion is equal to a thickness of the second portion at a position where the third portion is connected to the second portion.

12. A display device, comprising the display panel according to claim 1.

13. The display panel according to claim 1, wherein the preset bending region is configured to be bendable toward a direction away from the display layer.

14. A method of manufacturing a display panel, comprising:
providing a flexible substrate, wherein the flexible substrate includes an intermediate region and a preset bending region located at at least one side of a periphery of the intermediate region;
forming a display layer located at a side of the flexible substrate, wherein the display layer includes a plurality of light-emitting devices, and each of the plurality of light-emitting devices includes a top-emitting light-emitting device;
forming a transparent cover film layer located at a side of the display layer away from the flexible substrate, wherein the transparent cover film layer includes a first portion located at a side of the display layer away from the intermediate region, and a second portion located at a side of the display layer away from the preset bending region; and the first portion is connected to the second portion, and a thickness of at least a partial region of the second portion progressively decreases in a direction away from the first portion, wherein
the preset bending region is configured to be bendable toward a direction away from the display layer;
forming the display layer located at the side of the flexible substrate includes:
forming a reflective electrode at a side of the flexible substrate on the intermediate region and the preset bending region; and
sequentially evaporating a light-emitting functional layer, a transmissive electrode, and a capping layer at a side of the reflective electrode away from the flexible substrate on the intermediate region and the preset bending region.

15. The method of manufacturing a display panel according to claim 14, wherein
forming the display layer at a side of the flexible substrate, includes: forming a plurality of light-emitting devices on the intermediate region and the preset bending region;
forming the transparent cover film layer at a side of the display layer away from the flexible substrate, includes: forming a thin film encapsulation layer at a side of the display layer away from the flexible substrate, the thin film encapsulation layer being configured to encapsulate the plurality of light-emitting devices.

16. The method of manufacturing a display panel according to claim 14, wherein forming the transparent cover film layer at a side of the display layer away from the flexible substrate, includes:
forming, by using an inkjet printing process, a first organic layer at a side of the display layer away from the intermediate region, and a second organic layer at a side of the display layer away from the preset bending region; the first organic layer being connected to the second organic layer, wherein
by adjusting process parameters of the inkjet printing process, a thickness of at least a partial region of the second organic layer is controlled to progressively decrease in a direction away from the first organic layer.

17. The method of manufacturing a display panel according to claim 16, wherein
before forming the first organic layer and the second organic layer, forming the transparent cover film layer at a side of the display layer away from the flexible substrate, further includes:

forming, by using a same deposition process, a first inorganic layer at a side of the display layer away from the intermediate region, and a second inorganic layer at a side of the display layer away from the preset bending region; the first inorganic layer and the second inorganic layer being connected and having a same thickness.

18. The method of manufacturing a display panel according to claim 16, wherein after forming the first organic layer and the second organic layer, forming the transparent cover film layer at a side of the display layer away from the flexible substrate, further includes: forming, by using a same deposition process, a third inorganic layer at a side of the first organic layer away from the flexible substrate, and a fourth inorganic layer at a side of the second organic layer away from the flexible substrate; the third inorganic layer and the fourth inorganic layer are connected and have a same thickness.

19. The method of manufacturing a display panel according to claim 14, wherein forming the display layer at a side of the flexible substrate, includes: forming a plurality of light-emitting devices on the intermediate region and the preset bending region;

before forming the transparent cover film layer at a side of the display layer away from the flexible substrate, the method of manufacturing a display panel further comprises: forming a thin film encapsulation layer encapsulating the plurality of light-emitting devices at a side of the display layer away from the flexible substrate; and forming a bonding layer at a side of the thin film encapsulation layer away from the display layer, wherein the thin film encapsulation layer is configured to encapsulate the plurality of light-emitting device; and the bonding layer is configured to bond the thin film encapsulation layer and the transparent cover film layer.

* * * * *